(12) United States Patent
Kozlowski et al.

(10) Patent No.: US 6,809,767 B1
(45) Date of Patent: Oct. 26, 2004

(54) LOW-NOISE CMOS ACTIVE PIXEL SENSOR FOR IMAGING ARRAYS WITH HIGH SPEED GLOBAL OR ROW RESET

(76) Inventors: Lester J. Kozlowski, Simi Valley, CA (US); David L. Standley, Westlake Village, CA (US)

( * ) Notice: Subject to any disclaimer, the term of this patent is extended or adjusted under 35 U.S.C. 154(b) by 0 days.

(21) Appl. No.: 09/268,913

(22) Filed: Mar. 16, 1999

(51) Int. Cl.[7] .......................... H04N 3/14; H04N 5/335
(52) U.S. Cl. ...................................................... 348/308
(58) Field of Search ................................. 348/300, 301, 348/308; 250/208.1

(56) References Cited

U.S. PATENT DOCUMENTS

| | | | |
|---|---|---|---|
| 4,249,122 A | | 2/1981 | Widlar |
| 4,463,383 A | | 7/1984 | Sonoda et al. |
| 4,466,018 A | | 8/1984 | Sonoda et al. |
| 4,676,761 A | | 6/1987 | Poujois |
| 4,794,247 A | | 12/1988 | Stineman, Jr. |
| 5,043,820 A | | 8/1991 | Wyles et al. |
| 5,083,016 A | | 1/1992 | Wyles et al. |
| 5,296,696 A | | 3/1994 | Uno |
| 5,322,994 A | * | 6/1994 | Uno ........................ 250/214 A |
| 5,345,266 A | | 9/1994 | Denyer |
| RE34,908 E | | 4/1995 | Wyles et al. |
| 5,471,515 A | | 11/1995 | Fossum |
| 5,488,415 A | * | 1/1996 | Uno ........................... 348/241 |
| 5,541,402 A | | 7/1996 | Ackland et al. |
| 5,576,763 A | | 11/1996 | Ackland et al. |
| 5,587,596 A | | 12/1996 | Chi et al. |
| 5,608,243 A | | 3/1997 | Chi et al. |
| 5,892,540 A | * | 4/1999 | Kozlowski et al. ......... 348/300 |
| 5,929,434 A | * | 7/1999 | Kozlowski et al. ..... 250/214 A |
| 6,049,247 A | * | 4/2000 | Krymski ........................ 330/9 |
| 6,160,282 A | * | 12/2000 | Merrill ........................ 257/292 |
| 6,239,839 B1 | * | 5/2001 | Matsunaga et al. ......... 348/308 |
| 6,697,111 B1 | * | 2/2004 | Kozlowski et al. ......... 348/308 |

OTHER PUBLICATIONS

McGrath, R.D., et al., "FA 11.2: Current–Mediated, Current–Reset 768×512 Active Pixel Sensor Array" IEEE International Solid State Circuits Conference, US, IEEE Inc., New York, vol. 40, Feb. 1, 1997.

R.H. Dyck and G.P. Weckler, "Integrated arrays of silicon photodetectors for image sensing," IEEE Trans. Electron Devices, ED–15, Apr. 1968, pp. 196–201.

J.D. Plummer and J.D. Meindl, "MOS electonics for a portable reading aid for the blind," IEEE J. Solid–State Circuits, SC–7, Apr. 1972, pp. 111–119.

N. Koike, I. Takemoto, K. Satoh, S. Hanamura, S. Nagahara and M. Kubo, "MOS Area Sensor: Part I—Design consideration and performance of an n–p–n Structure 484×384 element color MOS Imager," IEEE Trans. Electron Devices, ED–27 (8), Aug. 1980, pp. 1676–1681.

(List continued on next page.)

Primary Examiner—Ngoc-Yen Vu
Assistant Examiner—Jason Whipkey (57) ABSTRACT

An active-pixel low-noise imaging system for implementation in CMOS or in other semiconductor fabrication technologies uses three transistors and a single capacitance per pixel. The first transistor serves as a reset and a transimpedance amplifier to facilitate high impedance and suppress reset noise without requiring expensive on-chip or off-chip memory. The second transistor is an access MOSFET used to read the signal from each pixel and multiplex the signal outputs from an array of pixels. The third MOSFET resets the detector after the integrated signal has been read. Since the detector sense node is "pinned" by the feedback amplifier, reset noise is reduced to that generated by the much smaller feedback capacitance. In addition, by using a small but well-defined feedback capacitor, an amplifier with a narrow bandwidth can be used, provided its unity-gain frequency is sufficient. Since the pixel-base amplifier's output capacitance is far smaller than the bus capacitance, the total energy consumed during reset is very small and overall power consumption is kept at a level consistent with battery-powered operation.

26 Claims, 4 Drawing Sheets

OTHER PUBLICATIONS

S. Ohba, M. Nakai, H. Ando, S. Hanamura, S. Shimada, K. Satoh, K. Takahashi, M. Kubo and T. Fujita, "MOS Area Sensor: Part II—Low–Noise MOS Area Sensor withi Antiblooming Photodiodes," IEEE Trans. Electron Devices, ED–27 (8), Aug. 1980, pp. 1682–1687.

EG&G Reticon Sales Catalog, *Image Sensing and Solid State Camera Products 1994/1995*. Solid State Image Sensor Array Specifications for Part Nos.: RA2568N, RA0100A/RA0128N and RA0256B.

H. Ando, S. Ohba, M. Nakai, T. Ozaki, M. Ozawa, K. Ikeda, T. Masuhara, T. Imaide, I. Takemoto, T. Suzuki and T. Fujita, "Design Consideration and Performance of a New MOS Imaging Device," IEEE Trans. On Elec. Dev., ED–32 (8), Aug. 1985, pp. 1484–1489.

N. Tanaka, T. Ohmi and Y. Nakamura, "A Novel Bipolar Imaging Device with Self–Noise–Reduction Capability," IEEE Trans Elec. Dev., 36 (1), Jan. 1989, pp. 31–38.

G.P. Weckler, "Storage Mode Operation of a Phototransistor and its Adaptation to Integrated Arrays for Image Detection," IEDM, Oct. 1966. . (Abstract only) No known paper available from professional document delivery services.

N. Tanaka, T. Ohmi, Y. Nakamura and S.Matsumoto, "A Low–Noise Bi–CMOS Linear Imager Sensor with Auto–Focusing Fucntion," IEEE Trans Elec. Dev., 36 (1), Jan. 1989, pp. 39–45.

N. Tanaka, S. Hashimoto, M. Shinohara, S. Sugawa, M. Morishita, S. Matsumora, Y. Nakamura and T. Ohmi, A 310k Pixel Bipolar Imager (BASIS), ISSCC 1989.

G. P. Weckler, "Charge Storage Lights the Way for Solid–State Image Sensors", Electronics, May 1, 1967, pp. 75–78.

G.P. Weckler, "Operation of p–n Junction Photodetectors in a Photon Flux Integrated Mode", IEEE Journal of Solid State Circuits, vol. SC–2, No. 3, Sep. 1967, pp. 65–73.

G.P. Weckler and R.H. Dyck, "Integrated Arrays of Silicon Photodetectors for Image Sensing", WESCON, Aug. 22–25, 1967, pp. 1–8.

L.J. Kozlowski, J. Luo, W.E. Kleinhans and T. Liu, "Comparison of Passive and Active Pixel Schemes for CMOS Visible Imagers", SPIE, vol. 3360, Apr. 1998.

Ming–Jer Chin, Yen–Bin Gu, Terry Wu, Po–Chin Hsu, and Tsung–Hann Liu, "Weak Inversion Charge Injection in Analog Mos Switches", IEEE Journal of Solid–State Circuits, vol. 30, No. 5, May 1995, pp. 604–606.

Peter W. Fry, Peter J.W. Noble and Rober J. Rycroft, "Fixed–Pattern Noise in Photomatrices", IEEE Journal of Solid–State Circuits, vol. SC–5, No. 5, Oct. 1970, pp. 250–254.

Degrauwe et al., "A Micropower CMOS–Instrumentation Amplifier", IEEE Journal of Solid–State Circuits, vol. SC–20, No. 3, Jun. 1985, pp. 805–807.

Letter dated Jul. 31, 1998, from Gene Weckler, RAD–ICON Imaging Corp., addressed to Mark Wettler.

* cited by examiner

LOW-NOISE CMOS ACTIVE PIXEL SENSOR FOR IMAGING ARRAYS WITH HIGH SPEED GLOBAL OR ROW RESET

CROSS-REFERENCE TO RELATED APPLICATIONS

This application is related to U.S. Pat. No. 6,493,030 entitled "Low-Noise Active Pixel Sensor for Imaging Arrays With Global Reset" which is commonly owned with the present application.

BACKGROUND OF THE INVENTION

1. Field of the Invention

The present invention relates to electronic imaging devices and, in particular, to CMOS imagers having a relatively small number of analog components in each pixel.

2. Description of Related Art

There presently exist many alternatives to CCD sensors for generating video or still images. The various schemes can be grouped into two basic classes, depending upon whether signal amplification is performed at each pixel site or in support circuits outside the pixel array. Passive-pixel sensors perform amplification outside the array. Passive pixel sensors exhibit pixel simplicity and maximized optical fill factor. Active-pixel sensors include an amplifier at each pixel site. Active pixel sensors optimize signal transfer and sensitivity.

Figure 1:
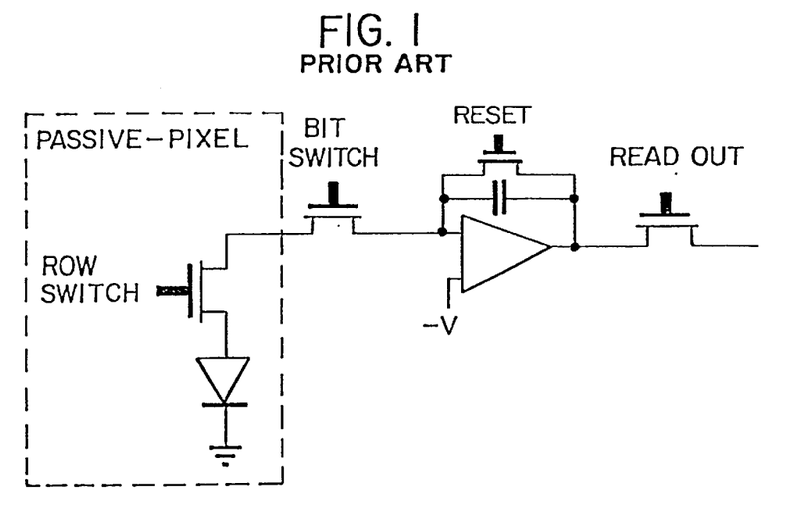
FIG. 1 is a schematic circuit diagram illustrating an amplifier system for a passive-pixel MOS photodiode array according to the prior art.
Figure 2:
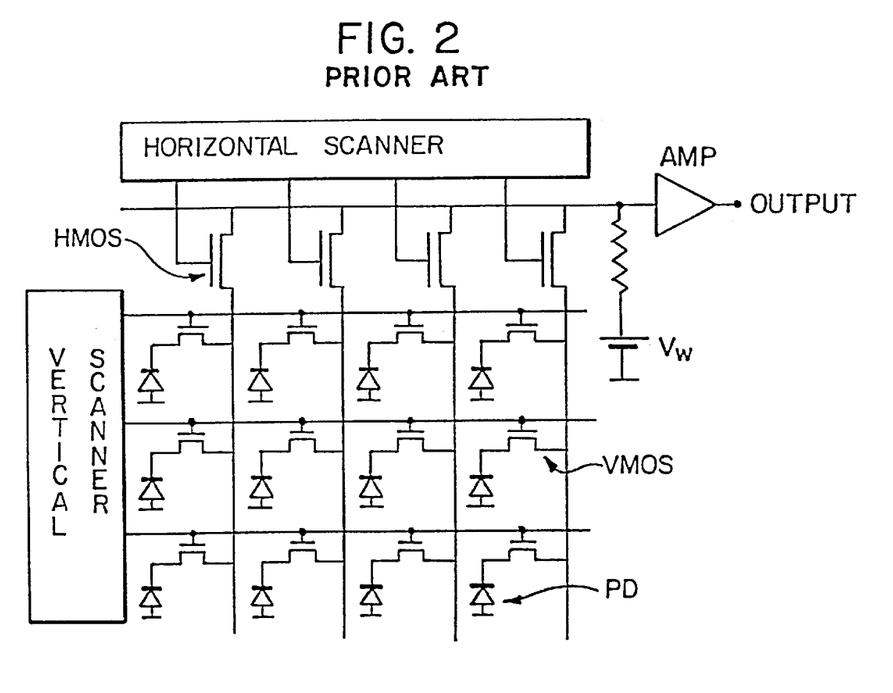
FIG. 2 is a schematic circuit diagram illustrating an amplifier system for a passive-pixel sensor according to the prior art.

The simplest passive pixel comprises a photodiode and an access transistor. The photo-generated charge is passively transferred from each pixel to downstream circuits. The integrated charge must, however, be efficiently transferred with low noise and non-uniformity. Since each column of pixels often shares a common row or column bus for reading the signal, noise and non-uniformity suppression are typically facilitated in the "column" buffer servicing each bus. One example of a prior art passive pixel implementation is shown in FIG. 1. It uses a buffer consisting of a transimpedance amplifier with capacitive feedback to yield reasonable sensitivity considering the large bus capacitance. Such charge-amplification was not generally practical for on-chip implementation in early MOS imaging sensors. Accordingly, alternative schemes compatible with NMOS technology were used. The basic prior art scheme shown in FIG. 2 was mass-produced by Hitachi for camcorders. The key refinements over the FIG. 1 scheme include anti-blooming control and circuitry for reducing fixed pattern noise. Though these imagers were inferior to the emerging charge coupled device (CCD) imagers available at the time, similar MOS imagers are still being offered commercially today.

Subsequent efforts at improving passive-pixel imager performance have also focused on column buffer enhancements. The column buffer was improved by using an enhancement/depletion inverter amplifier to provide reasonably large amplification in a small amount of real estate. Its 40 lux sensitivity was still nearly an order of magnitude below that of competing CCD-based sensors. Others worked to enhance sensitivity and facilitate automatic gain control via charge amplification in the column buffer. More recently, the capacitive-feedback transimpedance amplifier (CTIA) concept of FIG. 1 has served as a basis for further development, as exemplified by U.S. Pat. Nos. 5,043,820 and 5,345,266. The CTIA is nearly ideal for passive-pixel readout if the problems with temporal noise pickup and fixed-pattern noise are adequately addressed.

Though much progress has been made in developing passive-pixel imagers, their temporal S/N performance is still fundamentally inferior to competing CCD imagers. Their bus capacitance translates to read noise of at least 60 e- for 352×288 formats. Since the bus capacitance increases with array size, larger formats have even higher noise. CCDs, on the other hand, typically have read noise of 20 to 40 e- at video frame rates. The allure of producing imagers with conventional MOS fabrication technologies rather than esoteric CCD processes (which usually require many implantation steps and complex interface circuitry) encouraged the development of active-pixel sensors. In order to mitigate the noise associated with the bus capacitance, amplification was added to the pixel via the phototransistor. One such approach called a Base-Stored Image Sensor (BASIS) used a bipolar transistor in emitter follower configuration with a downstream correlated double sample to suppress random and temporal noise. By storing the photogenerated-signal on the phototransistor's base to provide charge amplification, the minimum scene illumination was reduced to $10^{-3}$ lux in a linear sensor array. However, the minimum scene illumination was higher ($10^{-2}$ lux) in a two-dimensional BASIS imager having 310,000 pixels because the photoresponse non-uniformity was relatively high ($\leq 2\%$). These MOS imagers had adequate sensitivity, but their pixel pitch was too large at about 13 $\mu$m. This left the problem of shrinking the pixel pitch while also reducing photoresponse non-uniformity.

Since the incorporation of bipolar phototransistors is not strictly compatible with mainstream CMOS processes, some approaches have segregated photodetection and signal amplification. U.S. Pat. Nos. 5,296,696 and 5,083,016, for example, describe active-pixel sensors essentially comprising a three-transistor pixel with photodiode. These implementations still exhibit inadequate performance. The '696 patent, for example, augments the basic source-follower configuration of the '016 patent with a column buffer that cancels fixed pattern noise, but adds a fourth transistor that creates a floating node vulnerable to generation of random offsets for charge-pumping and concomitant charge redistribution. The '016 patent offers a method for reducing offset errors, but not with adequate accuracy and resolution to be useful for competing with CCDs. Furthermore, these and other similar approaches requires 3–4 transistors in the pixel (at least one of which is relatively large to minimize 1/f noise) in addition to the photodiode. These implementations also require off-chip signal processing for best S/N performance because none addresses the dominant source of temporal noise. In order to eliminate or greatly suppress the reset noise (kTC) generated by resetting the detector capacitance, a dedicated memory element is usually needed, either on-chip or off-chip, to store the reset voltage to apply correlated double sampling and coherently subtract the correlated reset noise while the photo-generated voltage is being read.

This basic deficiency was addressed in U.S. Pat. No. 5,471,515 by developing an active pixel sensor (APS) that uses intra-pixel charge transfer to store the reset charge at each pixel at the start of each imaging frame. The floating gate APS facilitates correlated double sampling with high efficiency by adding several transistors and relying on a photogate for signal detection. The concomitant drawbacks, however, are intractable because they increase imager cost. The former adds several transistors to each pixel and several million transistors to each imager thereby reducing production yield. The latter is not compatible with standard CMOS gate fabrication so a non-standard process must be developed. These deficiencies were tackled in U.S. Pat. Nos. 5,576,763 and 5,541,402 issued to Ackland et al. and U.S. Pat. Nos. 5,587,596 and 5,608,243 issued to Chi et al. Ackland addressed the image lag issues associated with the intra-pixel charge transfer means. But his approach still requires a nonstandard CMOS process. Chi reduced pixel complexity by using the simplest possible active pixel comprising only a phototransistor and reset MOSFET. Chi's implementation still suffers from reset noise and compromises spectral response at longer wavelengths because the photodiode is in an n-well.

Figure 3:
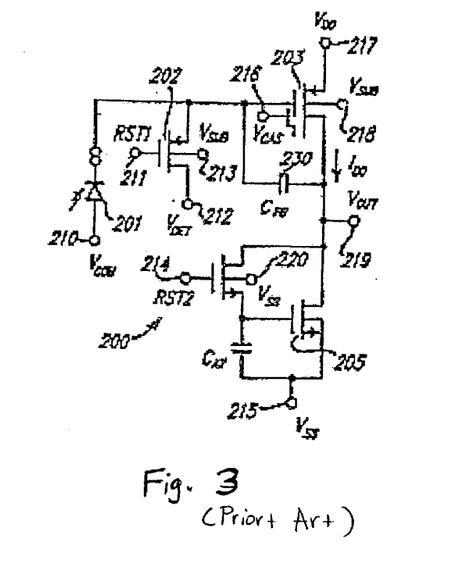
FIG. 3 is a schematic circuit diagram illustrating a transimpedance amplifier system for active-pixel imaging sensors according to the prior art (U.S. Pat. No. 4,794,247)

In addition to the aforementioned APS schemes that pursue charge-based signal manipulation to facilitate low temporal and fixed pattern noise in CMOS, alternative schemes use the native amplification provided by CMOS. FIG. 3, for example, is a schematic circuit diagram illustrating a transimpedance amplifier system for active-pixel imaging sensors (U.S. Pat. No. 4,794,247). This disclosure teaches a pixel-based CTIA with offset cancellation. This design provides high sensitivity if the feedback capacitance is minimized to thereby maximize transimpedance. Unfortunately, the need for both p-type and n-type transistors within the small pixel creates severe pixel real estate problems for the designer. The pixel layout is thus very inefficient in conventional LOCOS (local oxidation of silicon) processes because the p-FET must be in an n-well and the n-FET in a p-well. Ideally, only one transistor polarity should be present in the pixel to minimize circuit area and thereby maximize photodetector area.

SUMMARY OF THE INVENTION

The present invention comprises an active-pixel low-noise imaging system for implementation in CMOS or in other semiconductor fabrication technologies. The low-noise amplifier system greatly minimizes reset (kT/C) noise while simultaneously providing global reset using a minimum of active circuitry in each pixel including the photodetector and three transistors of identical polarity. The first transistor serves as a reset and a transimpedance amplifier to facilitate high impedance and suppress reset noise without needing expensive on-chip or off-chip memory. The second transistor is an access MOSFET used to read the signal from each pixel and multiplex the signal outputs from an array of pixels. The third MOSFET resets the detector after the integrated signal has been read. Since the detector sense node is "pinned" by the feedback amplifier, reset noise is reduced to that generated by the much smaller feedback capacitance. Also, by using a small but well-defined feedback capacitor, an amplifier with a narrow bandwidth can be used, provided its unity-gain frequency is sufficient; this is typical of DC amplifiers operated subthreshold. Since the pixel-base amplifier's output capacitance is far smaller than the bus capacitance, the total energy consumed during reset is very small and overall power consumption is kept at a level consistent with battery-powered operation. In addition, all the pixels may be reset simultaneously to facilitate synchronous image formation across the entire imager. In the typical two-dimensional array, the signal readout and multiplexing are performed, as in the prior art, by horizontal and vertical shift registers.

BRIEF DESCRIPTION OF THE DRAWINGS

Other objects and the many attendant advantages of this invention will be readily apparent upon reference to the following detailed descriptions when considered in conjunction with the accompanying drawings in which like reference numerals designate like parts throughout the figures, and wherein.

DETAILED DESCRIPTION OF THE PREFERRED EMBODIMENTS

Visible imaging systems implemented in CMOS have the potential for significant reductions in cost and power requirements in components such as image sensors, drive electronics, and output signal conditioning electronics. A video camera, for example, can be configured as a single CMOS integrated circuit supported by only an oscillator (i.e. clock) and a battery. Such a CMOS imaging system requires lower voltages and dissipates less power than a CCD-based system. These improvements translate into smaller camera size, longer battery life, and applicability to many new products.

Because of the advantages offered by CMOS visible imagers, there has been considerable effort to develop active-pixel sensor (APS) devices. Active-pixel sensors can provide low read noise comparable or superior to scientific grade CCD systems. The active circuit in each pixel of an APS device, however, utilizes cell "real estate" that could otherwise be used to enable imagers having optical format compatible with standard lenses and/or to maximize the sensor optical fill factor for high sensitivity. Active-pixel circuits also may increase power dissipation relative to passive-pixel alternatives, increase fixed pattern noise (possibly requiring additional circuitry to suppress the noise), and limit scalability.

A low noise amplifier according to the present invention is formed by the aggregate circuitry in each pixel and the column buffer servicing that column or row of pixels. The signals from the active pixels are subsequently read using a standard column buffer augmented with a current source supporting a high transimpedance amplifier in each pixel. In addition to suppressing the detector's reset noise, the column buffer in the downstream electronics typically performs additional correlated double sampling, sample-and-hold, optional video pipelining, and column amplifier offset cancellation functions to suppress the temporal and spatial noise that would otherwise be generated by the column buffer.

The low-noise system of the present invention provides the following key functions: (1) synchronous image formation for distortion-free image capture; (2) suppression of reset noise without having to provide means for analog memory and signal subtraction for each pixel to facilitate correlated double sampling; (3) signal readout with high sensitivity; and (4) compatibility with imaging array fabrication at pixel pitch smaller than 5 microns.

The present invention has the advantage of full process compatibility with standard silicided submicron CMOS, helps to maximize yield and minimize die cost because the circuit complexity is distributed amongst the active-pixels and peripheral circuits, and exploits the signal processing capability inherent in CMOS. The invention's spectral response is broad from near ultraviolet (400 nm) to near-infrared (>800 nm). A final advantage is the flexibility to collocate digital logic and signal-processing circuits due to the high immunity to electromagnetic interference provided by the signal amplification.

Because the low-noise system of the present invention has only three MOSFETs of identical polarity in each pixel, the invention offers competitive as-drawn optical fill factor. In a presently preferred embodiment, implemented using 0.6 $\mu$m design rules, 34% fill factor was achieved in a 7 $\mu$m by 15 $\mu$m pixel. The effective optical fill factor is somewhat larger due to lateral collection and the large diffusion length of commercial CMOS processes.

The low-noise APS system provides temporal read noise of <20 e- (at data rates compatible with either video imaging or still photography via electronic means), fixed pattern noise significantly below 0.1% of the maximum signal (on par with competing CCD imagers), <0.5% nonlinearity, >=1.5 V swing for 3.3 V power supply, large charge-handling capacity, and variable sensitivity using simple serial interface updated on a frame-by-frame basis via digital interface to a host microprocessor.

The CMOS readout and amplification system of the present invention includes a practical design for an active-pixel array that enables competitive optical fill factors and very low read noise. A prototype embodiment of the low-noise APS invention forms a visible imager comprising an array of 1024 (columns) by 512 (rows) of visible light detectors (photodetectors). The rows and columns of pixels are spaced 15 microns and 7 microns, respectively, using standard 0.6 $\mu$m design rules. Subsequent CAD layouts using 0.5 and 0.25 $\mu$m rules show that the invention provides similar fill factor at a highly desirable pitch of 5 $\mu$m in both directions. Four columns and rows of detectors at the perimeter of the light-sensitive region are covered with metal and used to establish the dark level for off-chip signal processing. In addition, the detectors in each row are covered with color filters to produce color imagers. For example, the odd rows may begin at the left with red, green, then blue filters, and the even rows may begin with blue, red, then green filters, with these patterns repeating to fill the respective rows.

Figure 4:
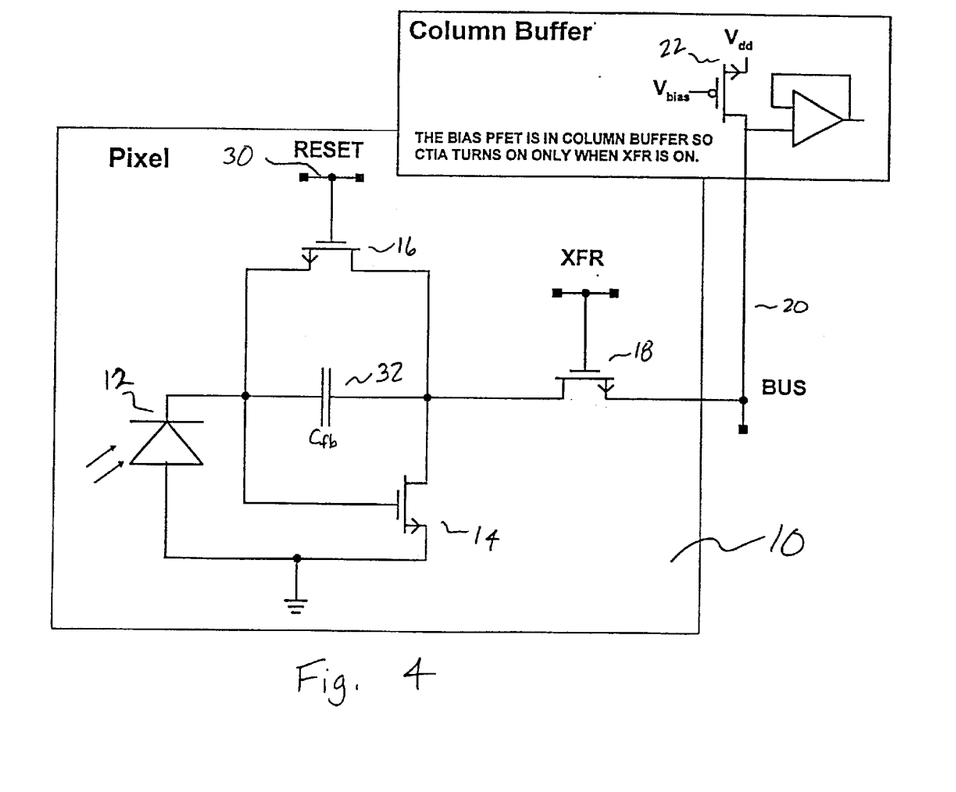
FIG. 4 is a/schematic circuit diagram illustrating a low-noise active-pixel sensor according to the present invention implemented in a 7 $\mu$m×15 $\mu$m pixel configuration using 0.6 $\mu$m CMOS.

A low-noise active-pixel sensor 10 according to the present invention is illustrated in FIG. 4. In the preferred embodiment, each pixel 10 in a sensor array (not shown) comprises a photodetector, such as a photodiode 12, for example, connected to the gate of a dual-driver MOSFET 14, and one leg of a reset MOSFET 16. A feedback capacitance 32 is connected across the source and drain of the reset MOSFET 16, and between the gate and the source legs of the dual-driver MOSFET 14. A row select MOSFET 18 has one leg connected to MOSFET 14. Column bus 20 connects all the pixels in a column of the photodetector array by way of the row select MOSFET 18 to a source supply 22. A global reset bus 30 connects to the gate of reset MOSFET 16. Photodiode 12 may comprise a substrate diode, for example, with the silicide cleared. In this embodiment, it is necessary to clear the silicide because it is opaque to visible light. Pixel 10 is designed as simply as possible to obtain the largest available light detecting area while providing broad spectral response, control of blooming and signal integration time, and compatibility with CMOS production processes.

For maximum compatibility with standard submicron CMOS processes, photodiode 12 may be formed at the same time as the lightly doped drain (LDD) implant of n-type MOSFETs for the chosen process; this creates an n-on-p photodiode junction in the p-type substrate. Since no additional ion implantation is necessary, the process and wafer cost for active-pixel circuit 10 are the same as those of standard, high volume digital electronic products.

The photodetectors 12 are reset simultaneously throughout the array. Reset is initiated by fully enabling the row select MOSFETs 18 of the pixels in the array, thereby connecting a current source located in each column buffer to the active pixels in each column. The current source may be an n-type MOSFET 22 driven by a bias voltage, $V_{bias}$ and powered from $V_{dd}$. Topologically, the pixel amplifiers throughout the imager are configured as distributed transimpedance amplifiers with capacitive-feedback provided by a specific feedback capacitance $C_{fb}$ 32. In the preferred embodiment, $C_{fb}$ 32 is drawn at 12.6 fF to facilitate greater than 12 bit dynamic range. However, $C_{fb}$ can be made as small as approximately 0.1 fF to minimize read noise. At 1 fF, for example, the read noise is made as low as 2 e- at video frame rates by intentionally adding capacitance (~2pF) to the bus (a typical bus has a capacitance of approximately 1 to 2 pF for typical television-like formats). The inventors have determined that the circuit performs well with a value of $C_{fb}$ up to approximately 15 fF, depending upon design requirements. Those skilled in the art can determine the most appropriate value of $C_{fb}$ within the disclosed range for a particular design's performance requirements.

The driver MOSFET 14 thus acts as a transconductance, and reset MOSFET 16 acts as a switch controlled by the reset clock. The amplifier and photodiode reset within an aperture of microseconds using standard 0.6 micron CMOS technology. The invention also reduces the fixed-pattern offsets from the driver MOSFET 14 in each pixel because the photodiode node charges to a voltage that suppresses driver MOSFET 14 variations from pixel-to-pixel.

The imager then integrates the signal for a prescribed integration time after which a mechanical shutter is closed to prevent further signal integration. The signals from the photodiodes 12 are subsequently read out after the prescribed integration time one row at a time, from the bottom to the top of the array. Within each row, for example, the photodiodes 12 are read out from left to right. Readout is initiated by enabling the access MOSFETs 18 of all the photodiodes 12 in each selected row, on a row-by-row basis. The pixel amplifiers in the selected rows are configured as distributed transimpedance amplifiers with the transimpedance established primarily by the feedback capacitance $C_{fb}$ 32 and by the MOSFET overlap capacitance implemented in each pixel and current source supplied by each column buffer. When extremely high transimpedance is needed, the gate-drain capacitance of the driver MOSFET 14 may be set as the primary "transcapacitance" by not implementing the feedback capacitance $C_{fb}$ 32, or by disabling the feedback capacitance $C_{fb}$ 32. The driver MOSFET 14 thus acts as a transconductance, and the signals read out with high sensitivity.

Figure 5:
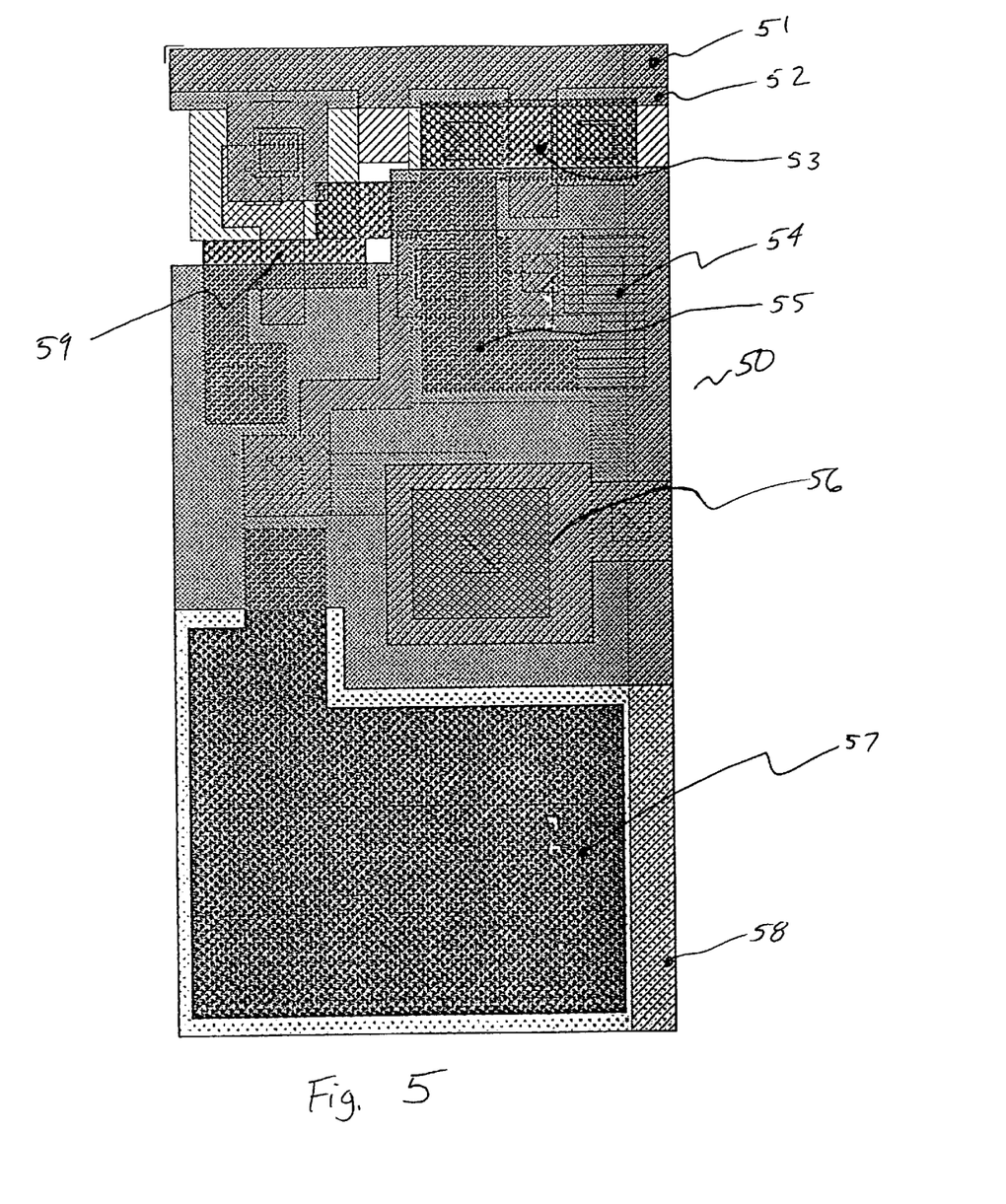
FIG. 5 is a CAD layout illustrating the low-noise active-pixel sensor according to the present invention implemented in a 7 $\mu$m×15 $\mu$m configuration using 0.6 $\mu$m CMOS.

FIG. 5 illustrates a Computer Aided Design (CAD) layout of a low-noise active-pixel sensor 50 according to the present invention implemented in a 7 μm×15 μm pixel configuration using 0.6 μm CMOS. The regions include: transfer bus 51, reset bus 52, transfer FET 53, ground connect 54, amplifier FET 55, $C_{fb}$ 56, photodiode 57, signal bus 58, and reset FET 59.

Figure 6:
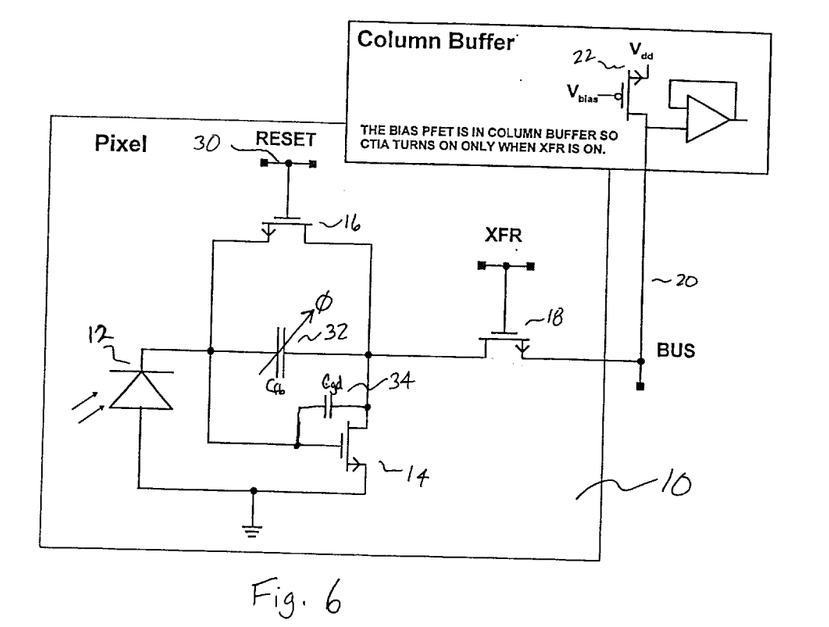
FIG. 6 is a schematic circuit diagram illustrating a second embodiment of the low-noise active pixel of the present invention.

In a second embodiment, highest possible sensitivity is facilitated by using the overlap capacitance $C_{gd}$ 34, i.e., the Miller capacitance of the inverter amplifier, as the primary gain mechanism. This configuration would be preferred for achieving<10 e- read noise and as low as 2 e- read noise at television-like frame rates. In this alternative embodiment, shown in FIG. 6, the photodiodes 12 are reset globally or on a row-by-row basis throughout the array. Progressive reset is initialized by enabling the access MOSFETs 18 in each successive row, thereby connecting the current source located in each column buffer to the active pixels in each selected row. Progressive reset is preferred in order to minimize the substrate transient that occurs when the entire array or row is reset. By distributing the reset process, a progressive reset design reduces the reset current, and thereby reduces the substrate transient. The current source can simply be an appropriately sized n-type MOSFET 22 driven by a bias voltage $V_{bias}$ and powered from $V_{dd}$ to supply the necessary current for row reset. Topologically, the pixel amplifiers in the selected row are configured as distributed transimpedance amplifiers with capacitive feedback provided by the MOSFET overlap capacitance $C_{gd}$ 34 implemented in each pixel, rather than the larger feedback capacitance $C_{fb}$ 32 of FIG. 4. The driver MOSFET 14 thus acts as a transconductance, and reset MOSFET 16 acts as a switch controlled by the reset clock. The amplifier and photodiode are reset within a few microseconds using standard 0.6 micron CMOS technology. The invention also reduces the fixed-pattern offsets from the driver MOSFET 14 in each pixel because the photodiode node charges to a voltage that suppresses the driver MOSFET 14 variations from pixel-to-pixel.

Figure 7:
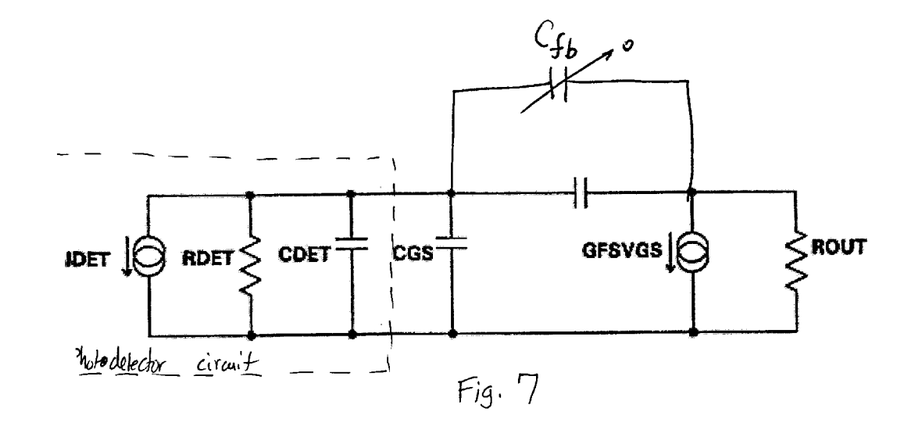
FIG. 7 is a schematic circuit diagram illustrating a small signal equivalent circuit of the present invention.

FIG. 7 is a schematic circuit diagram illustrating the small signal equivalent circuit of the alternate embodiment. The feedback capacitance Cf can be set to zero and typically smaller Cgd is used for generating the highest possible sensitivity. A photo detector circuit including current source IDET, resistance RDET, and capacitance CDET is coupled in parallel with capacitance Cgs. Current source GFSVGS is coupled in parallel with resistance Rout.

Although the present invention has been described with respect to specific embodiments thereof, various changes and modifications can be carried out by those skilled in the art without departing from the scope of the invention. Therefore, it is intended that the present invention encompass such changes and modifications as fall within the scope of the appended claims.

What is claimed is:

1. An active-pixel sensor circuit having a photodetector, an access transistor, a reset transistor and an amplifier transistor, the circuit comprising:

a feedback capacitor connected between a node and a drain of the amplifier transistor, the node formed by the photodetector and a gate of the amplifier transistor;

a column buffer connected to the access transistor via a column bus; and wherein the feedback capacitor has a capacitance within the range of approximately 0.1–15 fF.

2. The circuit of claim 1, wherein the photodetector comprises a photodiode formed as a substrate diode having the silicide cleared.

3. The circuit of claim 1, wherein the amplifier transistor is configured as a distributed transimpedance amplifier having capacitive feedback provided by the feedback capacitor.

4. The circuit of claim 2, wherein the transistors are MOSFETs of identical polarity fabricated in CMOS.

5. An active-pixel sensor circuit having a photodetector, an access transistor, a reset transistor and an amplifier transistor, the circuit comprising:

a feedback capacitor connected between a node and a drain of the amplifier transistor, the node formed by the photodetector and a gate of the amplifier transistor;

a column buffer connected to the access transistor via a column bus; and wherein the feedback capacitor has a capacitance of approximately 12.6 fF.

6. The circuit of claim 5, wherein the photodetector comprises a photodiode formed as a substrate diode having the silicide cleared.

7. The circuit of claim 5, wherein the amplifier transistor is configured as a distributed transimpedance amplifier having capacitive feedback provided by the feedback capacitor.

8. The circuit of claim 7, wherein the transistors are MOSFETs of identical polarity fabricated in CMOS.

9. The circuit of claim 5, wherein the photodetector comprises a photodiode formed as a substrate diode having the silicide cleared.

10. The circuit of claim 5, wherein the amplifier transistor is configured as a distributed transimpedance amplifier having capacitive feedback provided by the feedback capacitor.

11. The circuit of claim 10, wherein the transistors are MOSFETs of identical polarity fabricated in CMOS.

12. An active-pixel sensor circuit having a photodetector, an access transistor, a reset transistor and an amplifier transistor, the circuit comprising:

a feedback capacitor connected between a node and a drain of the amplifier transistor, the node formed by the photodetector and a gate of the amplifier transistor;

a column buffer connected to the access transistor via a column bus; and wherein the feedback capacitor comprises a gate-drain capacitance of the amplifier transistor.

13. An active pixel sensor circuit comprising:

a photodetector element having a node;

a reset transistor having a source connected to the node and a gate connected to a reset bus;

an amplifier transistor having a source connected to the photodetector, a gate connected to the node, and a drain connected to a drain of the reset transistor;

a feedback capacitor connected between the gate and drain of the amplifier transistor;

a transfer transistor having a drain connected to the drain of the amplifier transistor, a gate connected to a transfer signal bus, and a source connected to a column bus;

a column buffer connected to the column bus; and wherein the feedback capacitor has a capacitance within the range of approximately 0.1–15.

14. The circuit of claim 13, wherein the photodetector comprises a photodiode formed as a substrate diode having the silicide cleared.

15. The circuit of claim 13, wherein the amplifier transistor operates as a distributed transimpedance amplifier having capacitive feedback provided by the feedback capacitor.

16. The circuit of claim 15, wherein the transistors are MOSFETs of identical polarity fabricated in CMOS.

17. An active pixel sensor circuit comprising:

a photodetector element having a node;

a reset transistor having a source connected to the node and a gate connected to a reset bus;

an amplifier transistor having a source connected to the photodetector, a gate connected to the node, and a drain connected to a drain of the reset transistor;

a feedback capacitor connected between the gate and drain of the amplifier transistor;

a transfer transistor having a drain connected to the drain of the amplifier transistor, a gate connected to a transfer signal bus, and a source connected to a column bus;

a column buffer connected to the column bus; and wherein the feedback capacitor has a capacitance of approximately 12.6 fF.

18. The circuit of claim 17, wherein the photodetector comprises a photodiode formed as a substrate diode having the silicide cleared.

19. The circuit of claim 17, wherein the amplifier transistor operates as a distributed transimpedance amplifier having capacitive feedback provided by the feedback capacitor.

20. The circuit of claim 19, wherein the transistors are MOSFETs of identical polarity fabricated in CMOS.

21. An active pixel sensor circuit comprising:

a photodetector element having a node;

a reset transistor having a source connected to the node and a gate connected to a reset bus;

an amplifier transistor having a source connected to the photodetector, a gate connected to the node, and a drain connected to a drain of the reset transistor;

a feedback capacitor connected between the gate and drain of the amplifier transistor;

a transfer transistor having a drain connected to the drain of the amplifier transistor, a gate connected to a transfer signal bus, and a source connected to a column bus;

a column buffer connected to the column bus; and wherein the feedback capacitor comprises a gate-drain capacitance of the amplifier transistor.

22. The circuit of claim 21, wherein the photodetector comprises a photodiode formed as a substrate diode having the silicide cleared.

23. The circuit of claim 21, wherein the amplifier transistor operates as a distributed transimpedance amplifier having capacitive feedback provided by the feedback capacitor.

24. The circuit of claim 23, wherein the transistors are MOSFETs of identical polarity fabricated in CMOS.

25. An active pixel sensor circuit comprising:

a photodetector element having a node;

a reset transistor having a source connected to the node and a rate connected to a reset bus;

an amplifier transistor having a source connected to the photodetector, a gate connected to the node, and a drain connected to a drain of the reset transistor;

a feedback capacitor connected between the pate and drain of the amplifier transistor;

a transfer transistor having a drain connected to the drain of the amplifier transistor, a gate connected to a transfer signal bus, and a source connected to a column bus;

a column buffer connected to the column bus; and wherein the feedback capacitor comprises a gate-drain capacitance of the amplifier transistor.

26. The circuit of claim 15, wherein the amplifier transistor is configured as a distributed transimpedance amplifier having capacitive feedback provided by the feedback capacitor.

* * * * *